United States Patent [19]

Dietrich et al.

[11] 4,209,701
[45] Jun. 24, 1980

[54] MAGNETIC LENS ARRANGEMENT FOR CORPUSCULAR RADIATION EQUIPMENT WORKING UNDER A VACUUM

[75] Inventors: Isolde Dietrich; Fred Fox, both of Munich; Erwin Knapek, Unterhaching; Karl Nachtrieb, Munich; Reinhard Weyl, Assling; Helmut Zerbst, Munich; Guy LeFranc, Munich, all of Fed. Rep. of Germany

[73] Assignee: Siemens Aktiengesellschaft, Munich, Fed. Rep. of Germany

[21] Appl. No.: 891,894

[22] Filed: Mar. 30, 1978

[30] Foreign Application Priority Data

Jul. 12, 1977 [DE] Fed. Rep. of Germany ....... 2731458

[51] Int. Cl.² ............................................. H01J 37/00
[52] U.S. Cl. .............................. 250/396 ML; 250/398
[58] Field of Search ........... 250/396 ML, 396 R, 397, 250/398, 310; 335/210, 216; 313/361, 442

[56] References Cited

U.S. PATENT DOCUMENTS

| | | | |
|---|---|---|---|
| 3,008,044 | 11/1961 | Buchhold | 250/396 ML |
| 3,351,754 | 11/1967 | Dietrich et al. | 250/396 ML |
| 3,821,554 | 6/1974 | Zerbst et al. | 250/396 ML |

*Primary Examiner*—Bruce C. Anderson
*Attorney, Agent, or Firm*—Kenyon & Kenyon

[57] ABSTRACT

A magnetic lens arrangement for corpuscular radiation equipment working under a vacuum, in particular an objective lens for high voltage electron microscopes, which permits having objects to be examined disposed in a vacuum chamber at room temperature, is achieved by an arrangement which includes a vacuum chamber having a lens coil winding, a superconductive shielding device which is of cup-shaped design and encloses the winding, two superconductive shielding cylinders disposed one behind the other with mutual spacing enclosed by the winding, with a vacuum chamber for the object to be examined disposed in front of the open side of the shielding device and the first shielding cylinder.

7 Claims, 4 Drawing Figures

MAGNETIC LENS ARRANGEMENT FOR CORPUSCULAR RADIATION EQUIPMENT WORKING UNDER A VACUUM

BACKGROUND OF THE INVENTION

This invention relates to corpuscular radiation equipment in general and more particularly to an improved magnetic lens arrangement for corpuscular radiation equipment operating under a vacuum.

Magnetic lens arrangements are known for use in corpuscular radiation equipment, such as electron microscopes, which work under a vacuum. A typical prior art device includes a vacuum chamber which receives an object to be examined and at least one lens coil winding which is enclosed by a superconductive shielding device. The lens coil winding, which carries current during operation, is arranged around superconductive hollow cylindrical shielding parts which are disposed coaxial to the beam guidance axis of the lens arrangement mutually spaced one behind the other as viewed in the beam guidance direction. As a result, a gap of predetermined gap width is formed between their adjacent faces.

High voltage electron microscopes operate with beam voltages which can exceed 1000 kV. As disclosed in U.S. Pat. No. 3,916,201 it is sometimes expedient to provide several superconductive lens arrangements, disposed on a central carrier tube located in a cryostat, for such electron microscopes. In this manner a relatively compact electron microscope design is thus obtained. The lens system of known electron microscopes such as that of the aforementioned patent includes a lens arrangement of the type just described. This forms the objective lens of the lens system. It contains two hollow cylindrical shielding parts arranged one behind the other in the beam guidance direction each narrowly enclosing the beam guidance chamber. The two shielding cylinders consist of superconducting material which is kept below its transition temperature when in the operating condition through the use of a cryogenic medium such as helium. A narrow gap, in which a vacuum chamber is disposed, is formed between the adjacent faces of the shielding cylinders. An object to be examined can then be introduced into this chamber radially from the side using a special insertion device. The specimen chamber is also cooled by the cryogenic medium. Thus, while it is possible, in an arrangement such as this, to keep temperature related lateral migration of the specimen, which is referred to as thermal drift, to a minimum, e.g., to less than 0.03 nm/min, this known objective lens arrangment does not permit the examination of objects having higher temperatures, in particular objects which are at room temperature.

Each of the two shielding cylinders of the known electron microscope is surrounded by a superconducting lens coil winding which is shorted in the operating state. In other words, since there are essentially no losses in a superconductor, once a current is establisbed in a coil, the coil can be shorted and current will continue to flow. The purpose of the shielding cylinders is to have the magnetic field generated by the lens coil windings act upon the corpuscular beam only in the area of the lens gap. Thus, the faces of the two shielding cylinders facing away from each other are connected to a shielding device which also consists of a superconductive material. The shielding device encloses the outside surface and the faces of the lens coil windings. With the shielding housing designed in this manner and kept in the superconductive state, it is possible, in addition, to limit the outward spread of the magnetic field generated by the lens coil windings. It is also possible to shield the gap area in which the magnetic field acts upon the corpuscular beam against extraneous magnetic interference fields, particularly electromagnetic ac fields, to a large extent.

Since, as is known, the resolution capability of corpuscular radiation equipment depends on what is known as the apertual error constant of its lens, in particular this error constant of its objective lens, the size of the lens gap between the faces of the two shielding cylinders which are disposed opposite to each other in the known electron microscope is chosen so as to obtain a very small apertual error constant. Factors which affect the apertual error constant of such a lens arrangement include, in addition to the maximum field strength $H_o$ or the maximum magnetic induction $B_o$ in the lens gap, i.e. in the area in which the magnetic field acts upon the corpuscular beam, the field gradient along the beam guidance axis in the lens gap and thus also the design of the shielding cylinders in the area where they face each other.

These factors dictate a relatively small gap and because of this only objects cooled to the low temperature of the cryogenic medium can be examined with this objective lens arrangement. Moreover, objective lens of this type are suited only for electron microscopy utilizing what is known as the fixed beam technique. In this technique, a bunched electron beam is maintained fixed by means of magnetic fields. It penetrates the object, an enlarged picture of which is then produced by means of subsequent enlarging lens. However, this known electron magnetic microscope is not suited for what is known as a penetration scanning electron microscope. In this type of microscope, a sharply focused electron beam scans the surface of the object to be examined in accordance with a predetermined scanning scheme. If stray electrons originating from the scanning are to be registered and, if secondary electrons, as well as Auger electrons and back-scatter electrons, are to be picked up, in applicable circumstances, for additional energy dispersive radiation analysis, it is necessary that corresponding detection devices be mounted in the immediate vicinity of the object. The known objective lens design does not lend itself to such because the object chamber is too small and cannot be enlarged without either reducing the maximum field strength $H_o$ in the gap and the field gradient and thus increasing the image defects of the electron microscope, particularly its spherical and chromatic aberration, due to a corresponding enlargement of the apertual error constant.

SUMMARY OF THE INVENTION

Therefore, it is an object of the present invention to redesign this known objective lens arrangement in such a manner that a high voltage electron microscope equipped with the new objective lens can have an object chamber at room temperature and still have all its superconductive lens assembled into a column which can be installed in a common cryostat. In addition, it is desired to provide an objective lens which permits the electron microscope to be used for penetration scanning electron microscopy without having to forgo the essential advantages of the known fixed beam electron microscope. For example, the thermal drift of the object should be small, and at the same time the corpuscular beam should be shielded against external magnetic interference fields to a large degree. Beyond this, the electron microscope should be capable of a resolution of about 1 nm.

In accordance with the present invention this problem is solved, for a magnetic lens arrangement of the general type described above, by utilizing a shielding device of a cup-shaped design and by disposing the vacuum chamber which receives the object to be examined in front of the open side of the cup-shaped shielding device and in front of the face of the first shielding part facing away from the gap as viewed in the beam direction.

Because the shielding device enclosing the lens coil winding and the two hollow cylindrical shielding parts is of cup-shape design and is thus open on one side, the lens arrangement of the present invention acts like a magnetic lens system having two magnetic lens disposed one behind the other in the beam direction. The focal length of the first lens is relatively large while the focal length of the second lens can be kept very small, even at high beam voltages of, for example, 5000 kV. The advantages achieved with this design of the magnetic lens arrangement, in accordance with the present invention, then consist, in particular, in that the object to be examined can be placed several centimeters in front of the open side of the cup shaped shielding device and in front of the first hollow cylindrical shielding part. As a result, there are no difficulties encountered in providing a vacuum chamber having a warm object stage. Since this vacuum chamber can be of sufficiently large dimensions, the detection devices required for penetration scanning electron microscopy can easily be accomodated within it.

BRIEF DESCIPTION OF THE DRAWINGS

DETAILED DESCRIPTION OF THE INVENTION

Figure 1:
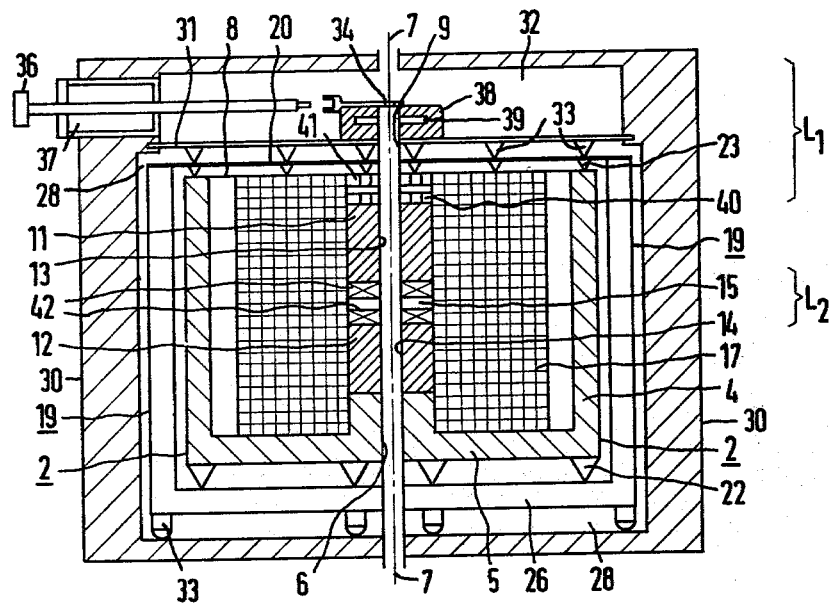
FIG. 1 is a schematic cross-sectional drawing of a first embodiment of a magnetic lens according to the present invention.

FIG. 1 illustrates an object lens arrangement which can be used both for a penetration scanning and a penetration fixed beam electron microscope. The microscope components which are not shown in the figure are well known in the art and may correspond, for example, to the components of the electron microscope described in U.S. Pat. No. 3,916,201. The objective lens arrangement includes a shielding device 2 consisting of a superconductive material. During operation, it is kept at a temperature below the critical temperature of this material by means of a cryogenic medium such as liquid helium. The shielding device 2 has a cup shape. In other words, it consists of a hollow cylindrical side part which forms the jacket of the shielding device and a bottom part 5 which closes off the side part 4 toward the bottom. The bottom part 5 has a central opening 6 through which an electron beam guided along an axis 7 is conducted there through. The top of the shielding device is closed by a cover part 8 shown in the figure only by a single line. It too has a corresponding opening 9 and consists of nonmagnetic material. Within the interior of the shielding device 2 are two hollow cylindrical shielding parts 11 and 12. Part 11 has a central bore 13 and part 12 a central bore 14. The diameter of the bores 13 and 14 is only a few millimeters. The shielding parts 11 and 12 are disposed concentric to the beam guidance axis 7. The shielding parts 11 and 12 also consist of superconductive material which is preferably cooled by the same cyrogenic medium required to cool the shielding device 2. They are disposed one behind the other with a mutual spacing as viewed in the beam guidance direction. This results in a narrow gap 15 being formed between the mutually adjacent faces of the parts 11 and 12. The lower cylindrical shielding part 12 stands on the bottom part 5 of the shielding device 2 and may, for example, form a integral molded part with it. The two cylindrical shielding parts 11 and 12 are surrounded by a current carrying lens coil winding 17. It too should have conductors made of superconductive material so that it can be shorted in the operating state in well known manner and still continue to conduct current. The coil winding 17 extends upwardly to the cover part 8 of the cup shaped shielding device 2.

In order to reduce heat transfer to the deeply cooled shielding device 2 and the components mounted within it, a radiation shield 19 is provided. The shield can be cooled by liquid nitrogen, for example. The radiation shield 19 is also of a cup shaped design and has its upper side closed by a cover part 20. At least this cover part 20 for the radiation shield 19, consists of a nonmagnetic material. As illustrated, the shielding device 2 is supported and fixed within the radiation shield 19 by being supported on spacers 22. The cover 20 of the radiation shield also has spacers 23, both of the spacers 22 and 23 being made of a material which is a poor heat conductor to aid in preventing undesirable heat transfer. The part 22 rests on the bottom 26 of the radiation shield 19 and the part 23 rests on the cover 8 for the shielding device 2.

The radiation shield 19, including the components mounted within it, is disposed in the evacuated chamber 28 of a housing 30 which is enclosed on all sides except for central lead throughs for the electron beam. The chamber 28 is the lower portion of the entire interior of housing 30 and is separated from an upper portion by a dividing wall 31. The upper portion 32 is located ahead of the separating wall 31 as viewed in the beam direction and is a vacuum chamber. The housing 30 is at room temperature so that poorly heat conducting supporting devices 33 are provided between it and the dividing wall on the one hand and the radiation shield 19 on the other hand, in order to keep heat transfer low. The vacuum chamber 32 is the specimen chamber. The means require to introduce and hold an object 34 to be examined within the vacuum chamber 32 are not shown in detail on FIG. 1. All that is illustrated is a specimen 36 and a lock chamber for permitting an object 34 to be introduced into the vacuum chamber 32 from the side so that it can be placed in the path of the electron beam in front of the shielding device 2 and the cylindrical shielding part 11. An annular specimen tray may be provided, for example, in front of whose central bore the object 34 is placed.

Since one side of the shielding device 2 is open due to its cup shaped design, the magnetic field generated by the lens coil winding 17 is not restricted to the interior inclosed by the shielding device 2. This magnetic field is thus affected not only in the area of the gap 15 between the two cylindrical shielding parts 11 and 12 but also extends into the vacuum chamber 32 in the area in front of the first cylindrical shielding part 11. This results in a magnetic double lens. Its first field range, as viewed in the beam direction, in front of the cylindrical shielding part 11 is marked $L_1$ in the figure and the field range in the gap 15 between the two cylindrical shielding parts is marked $L_2$.

Since the electron beam should be able to penetrate the object 34 in accordance with a scanning scheme, an appropriate detection device 39 is shown in FIG. 1 behind the object as seen in the beam direction. The detection device 39 is still ahead of the shielding device 2. Detection device 39 may be mounted in the specimen tray 38, for example. Since the object chamber 32 of the lens coil arrangement according to the present invention is at room temperature, it can be designed to be large enough so that additional detector systems, not shown in the figure, can be accomodated therein and be used for energy dispersive radiation analysis, particularly when the electron microscope is one operating using the scanning technique.

Also illustrated in FIG. 1 are a deflector 40 and two stigmator systems 41 and 42 for adjustment of the electron beam relative to the axis 7 of the lens arrangement. The first stigmator system 41, as viewed in the beam direction, and a portion of which may be preferably usable as a deflector at the same time, and a deflector 40 are located directly in front of the side of the first cylindrical shielding part 11 which faces away from the gap 15. The second stigmator system 42 is disposed in the gap 15 formed between the two cylindrical shielding parts 11 and 12.

Figure 2:
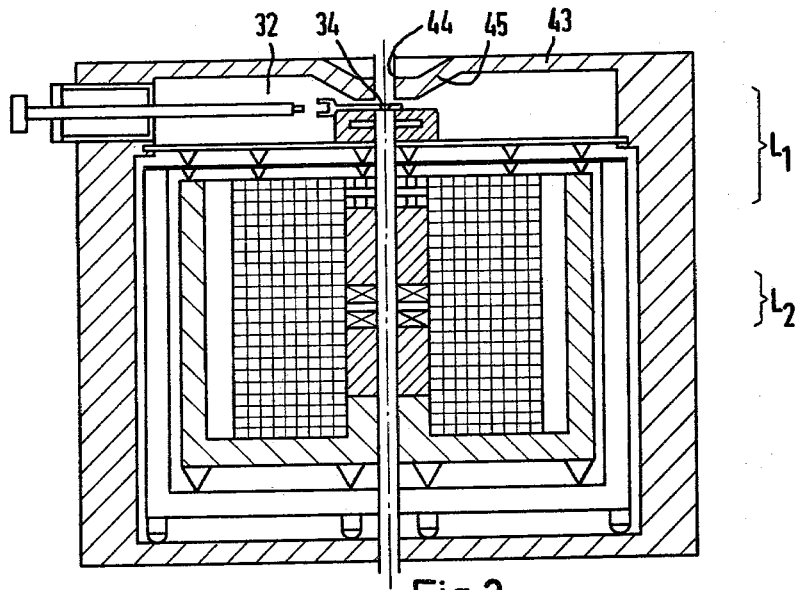
FIG. 2 is a similar view of a second embodiment of the present invention.

The housing 30 will advantageously consist of a ferromagnetic material in order to shield the beam guidance chamber, particularly in the area of the vacuum chamber 32, from interfering extraneous electromagnetic ac fields. Moreover, the distribution of the magnetic field in vacuum chamber 32 can be influenced by proper shaping of the housing. For example, the housing upper cover part 43 may take a special form. Such an embodiment is illustrated in FIG. 2. Except for the cover part 43, all components in FIG. 2 are identical with those of the embodiment of FIG. 1. In the area of the central lead through 44 for the electron beam, the cover part 43 is drawn inwardly so as to form a pole shoe 45 which extends into the vicinity of object 34 to be examined. This effects a concentration of the field representing the magnetic lens $L_1$ in the area of the object 34.

Figure 3:
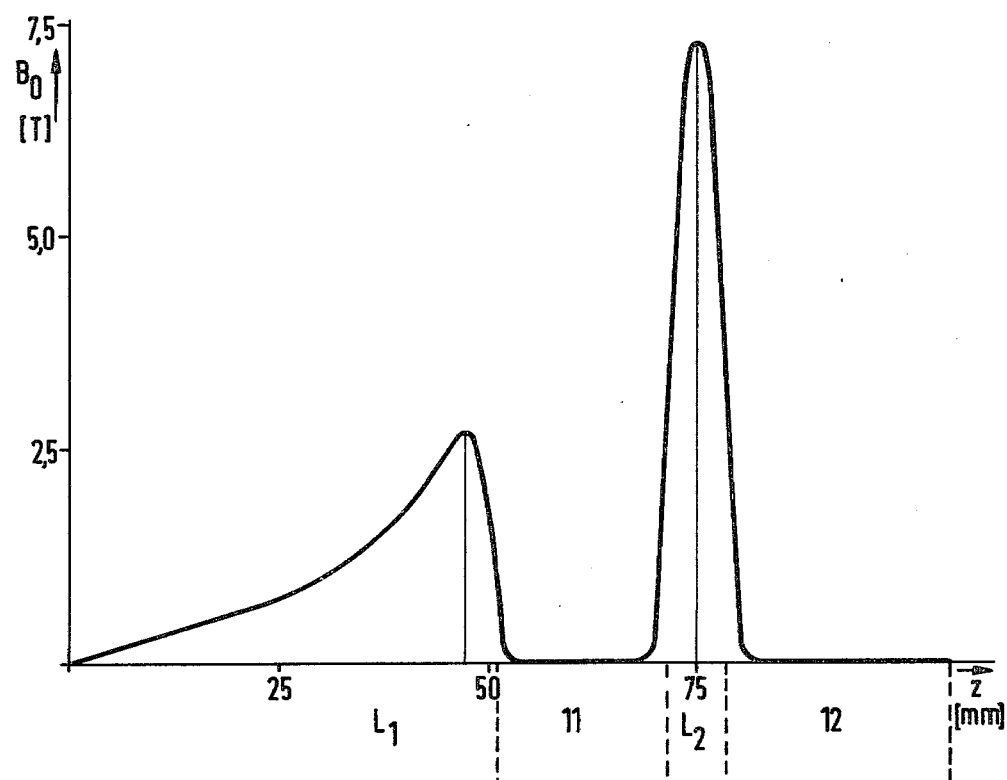
FIG. 3 is a diagram showing a field strength distribution along the beam guidance axis as produced by the objective lens arrangement of FIG. 1.

The magnetic field strength distribution along the axis within an objective lens arrangement according to FIG. 1 is shown by the diagram of FIG. 3. On this drawing, Z on the abscissa represents the distance from the entry of the electron beam into the housing in the beam guidance direction. The associated magnetic induction $B_o$ is plotted in Tesla on the ordinate. The double lens character of the objective lens arrangement according to the present invention is easy to see from this field configuration. The first partial lens of this magnetic double lens, marked $L_1$, is located ahead of the first cylindrical shielding part 11. Its stray field has an asymmetrical field strength distribution. The focal length of this lens is relatively great and the maximum induction $B_o$ relatively strong. By contrast, the field distribution of the second partial lens $L_2$, which is located in the gap between the two cylindrical shielding parts 11 and 12, the location of this gap being indicated by dashed lines below the abscissa, has a high maximum at a small half-power width so that the focal length of this partial lens $L_2$ is advantageously very short, not exceeding 6 mm, for example, even at beam voltages of 5000 kV.

The diagram of FIG. 3 is based on an example of an objective lens arrangement whose electronoptic data for the field distribution shown in FIG. 3 at a beam voltage of 3000 kV are listed in the following table.

TABLE

|  | $L_1$ | $L_2$ |  |
| --- | --- | --- | --- |
| Excitation | 42,000 | 42,000 | Ampere-Turns |
| Front focal length | 11 | 3.4 | mm |
| Rear focal length | 14 | 3.4 | mm |
| Front focal length coordinate | −12 | −2.3 | mm |
| Rear focal point coordinate | +3 | +2.3 | mm |
| Chromatic aberration constant | 18.5 | 2.6 | mm |
| Apertural error constant | 86 | 3.1 | mm |

The spot on the abscissa where the coordinate magnetic induction $B_o$ has its maximum has been taken as the zero point coordinate to which the focal point coordinates relate.

Figure 4:
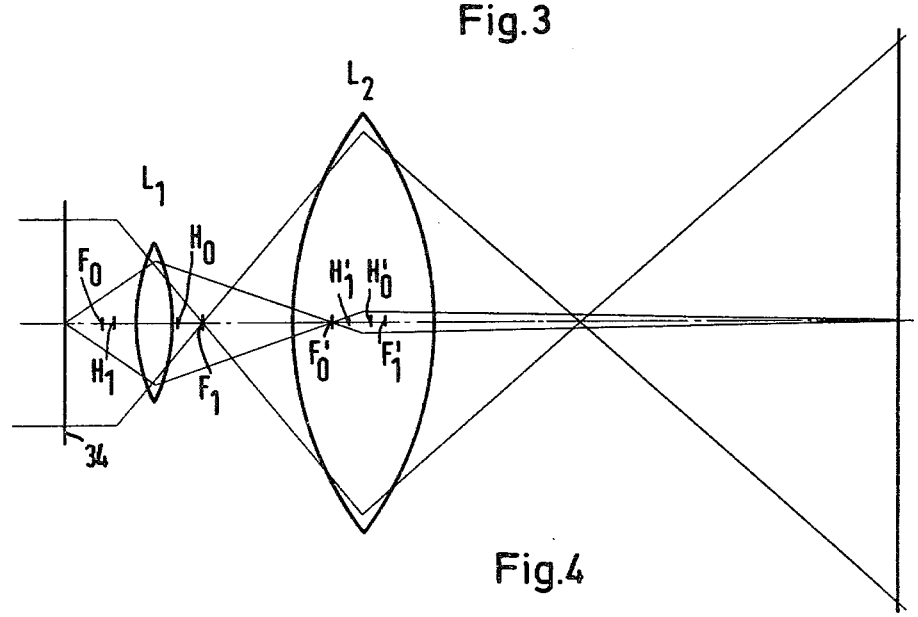
FIG. 4 is a diagram illustrating the beam path through the lens arrangement of FIG. 1.

The beam path of the objective lens arrangement according to the field distribution shown in FIG. 3 is sketched in FIG. 4. Coordinated to each of the partial lenses is a front and a rear principle plane whose points of intersection with the beam guidance axis are marked $H_o$ and $H_1$ respectively. The points related to the second partial lens $L_2$ are designated with a prime. The object 34 is located above the front focal point coordinate $F_o$ of the first partial lens $L_1$, spaced from this focal point coordinate by a distance smaller than or equal to the front focal length of the first partial lens $L_1$. Thus, the first intermediate image originates below the rear focal point coordinate at $F_1$, spaced from this focal point coordinate by a distance greater than or equal to the rear focal length of the first partial lens. It thus becomes possible to place a first intermediate image in this lens system into the upper part of the gap 15 of the second partical lens $L_2$. Because of this design principle, it is possible to arrange the object several centimeters above the upper edge of the first cylindrical shielding part 11. In turn, this permits providing a warm object stage without difficulty. Although this object stage is located outside of the superconductive shielding device 2 as illustrated by FIGS. 1 and 2, the lack of the superconductive shield in the area of the object 34 is of subordinate significance at beam voltages about 1000 kV.

What is claimed is:

1. In a magnetic lens arrangement for use in corpuscular radiation equipment working under a vacuum, said lens arrangement including a vacuum chamber to receive an object to be examined and at least one current-carrying lens coil winding which is enclosed by a superconductive shielding device and is disposed around two superconductive, hollow cylindrical shielding parts disposed coaxial to the beam guidance axis for the lens arrangement, the shielding parts being spaced one behind the other as viewed in the beam guidance direction with a gap of predetermined gap width formed between their adjacent faces, the improvement comprising, the shielding device being of cup shaped design and the vacuum chamber to receive the object to be examined being located in front of the open side of the cup shaped shielding device, and of the face of the first shielding part facing away from the gap, as viewed in the beam direction, said vacuum chamber being maintained at a temperature which is approximately room temperature.

2. The improvement according to claim 1 and further including equipments for radiation analysis mounted in said vacuum chamber.

3. The improvement according to claim 1 wherein the face of the second shielding part, as seen in the beam guidance direction, which faces away from the gap, is connected to said shielding device.

4. The improvement according to claim 3 wherein said second shielding part forms an integral molded part with said shielding device.

5. The improvement according to claim 1 wherein said shielding device and said vacuum chamber are disposed in a common shielding housing made of ferromagnetic material, said shielding housing being at room temperature.

6. The improvement according to claim 5 wherein said shielding housing is shaped in the form of a pole shoe at the point in said vacuum chamber where an object to be examined will be located.

7. The use of the magnetic lens arrangement according to claim 1 in electron microscopes having beam voltages over 1000 kV.

* * * * *